United States Patent [19]

Flum et al.

[11] Patent Number: 5,210,502

[45] Date of Patent: May 11, 1993

[54] SERVO DISTORTION TRIM FOR DBX VCA

[75] Inventors: Alan Flum, Ft. Lauderdale; Michael Zampini, Boca Raton; Fujio Yasuda, Coral Springs, all of Fla.

[73] Assignee: Sony Corporation of America, Park Ridge, N.J.

[21] Appl. No.: 826,522

[22] Filed: Jan. 12, 1992

[51] Int. Cl.⁵ .................... H03F 1/34; H03G 3/18
[52] U.S. Cl. .................... 330/85; 330/282; 381/119
[58] Field of Search .......... 330/9, 85, 149, 281, 330/282, 283; 381/119, 120, 121

[56] References Cited

U.S. PATENT DOCUMENTS

| | | | |
|---|---|---|---|
| 4,262,543 | 4/1981 | Grebe, Jr. et al. | 330/9 X |
| 4,335,361 | 6/1982 | Acker | 330/285 |
| 4,357,492 | 11/1982 | Campbell et al. | 381/119 X |
| 4,594,558 | 6/1986 | Congdon | 330/9 |
| 4,760,345 | 7/1988 | Büsser et al. | 330/9 |
| 4,928,059 | 5/1990 | Franklin et al. | 330/9 X |

Primary Examiner—Steven Mottola
Attorney, Agent, or Firm—Ronald P. Kananen

[57] ABSTRACT

A servo distortion trim circuit for a DBX VCA is disclosed. The circuit comprises a feedback to the VCA which includes an inverting integrator. The input to the non-inverting terminal of the integrator is chosen to minimize distortion.

3 Claims, 2 Drawing Sheets

5,210,502

SERVO DISTORTION TRIM FOR DBX VCA

FIELD OF THE INVENTION

The invention relates generally to minimization of distortion of output signals in an audio mixer.

BACKGROUND OF THE INVENTION

Audio mixers incorporating voltage control amplifiers (VCAs) are, per se, well known. The output of the VCAs, however, experience some distortion. While some attempts have been made to eliminate or minimize this distortion by using a potentiometer that trims for minimum distortion, these attempts have various drawbacks. For example, if a mixing apparatus has 20 VCAs, 20 trimming potentiometers may be necessary. This is very expensive and additionally may add a great deal of labor and cost to the manufacturing process, especially if the potentiometers must be manually adjusted to trim for minimum distortion.

SUMMARY OF THE INVENTION

It is an object of the present invention to overcome these and other drawbacks of the prior art. Specifically, it is an object of the invention to provide a circuit which automatically performs distortion trimming.

Our invention is based in part on our surprising discovery that the output off-set of a VCA circuit is a relatively constant value from sampel to sample at minimum THD. Additionally, we have discovered that the ratio of the output off-set to the symmetry trim adjustment voltage is approximately constant. Based on these observations, we have discovered that a servo circuit, with an inverting integrator that feeds back a small DC off-set with a very high gain to a control port of the VCA, eliminates the need to manually perform a symmetry adjustment using a trimming potentiometer.

DETAILED DESCRIPTION OF THE PREFERRED EMBODIMENTS

Figure 1:
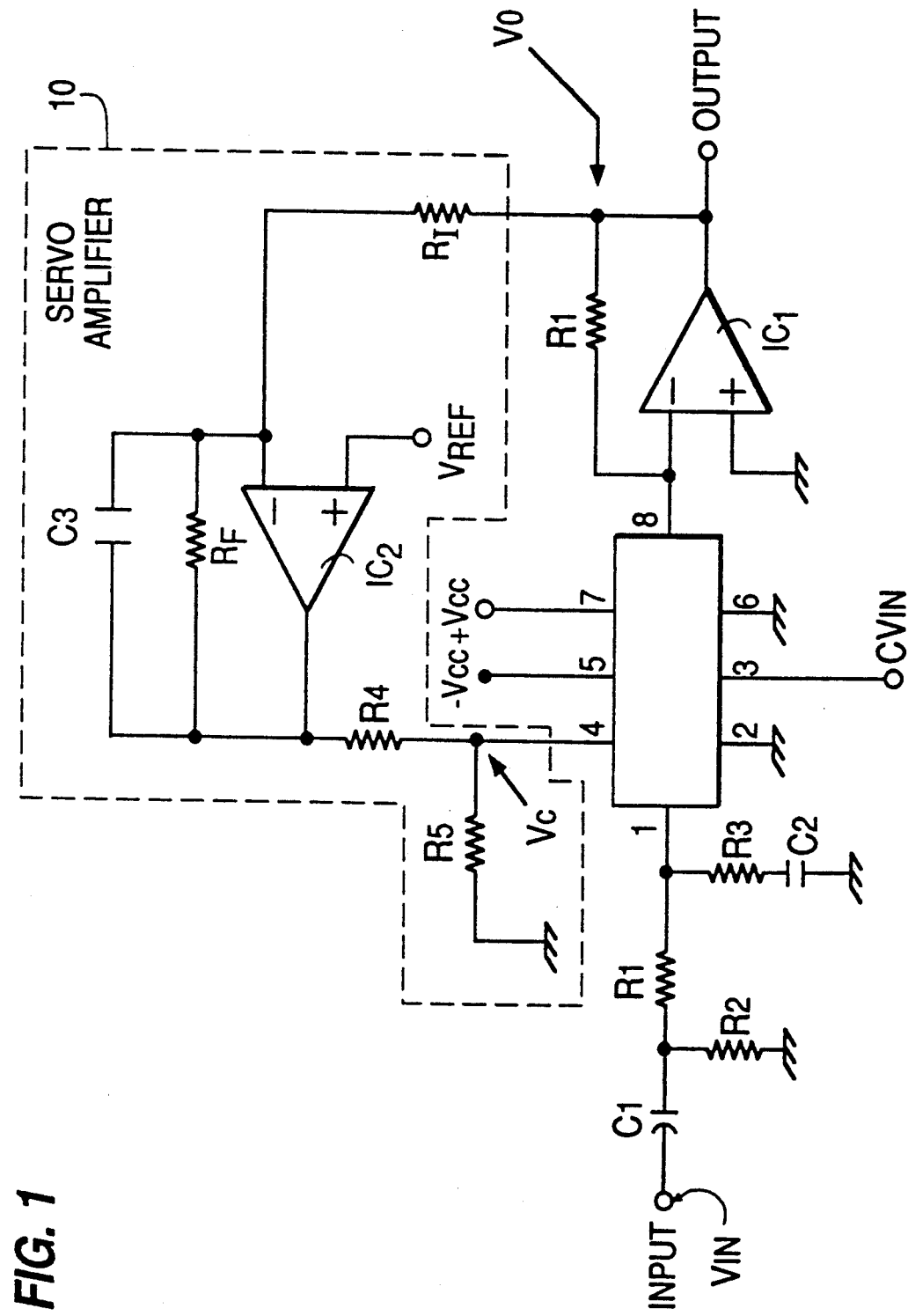
FIG. 1 is a schematic circuit diagram illustrating one aspect of the present invention.
Figure 2:
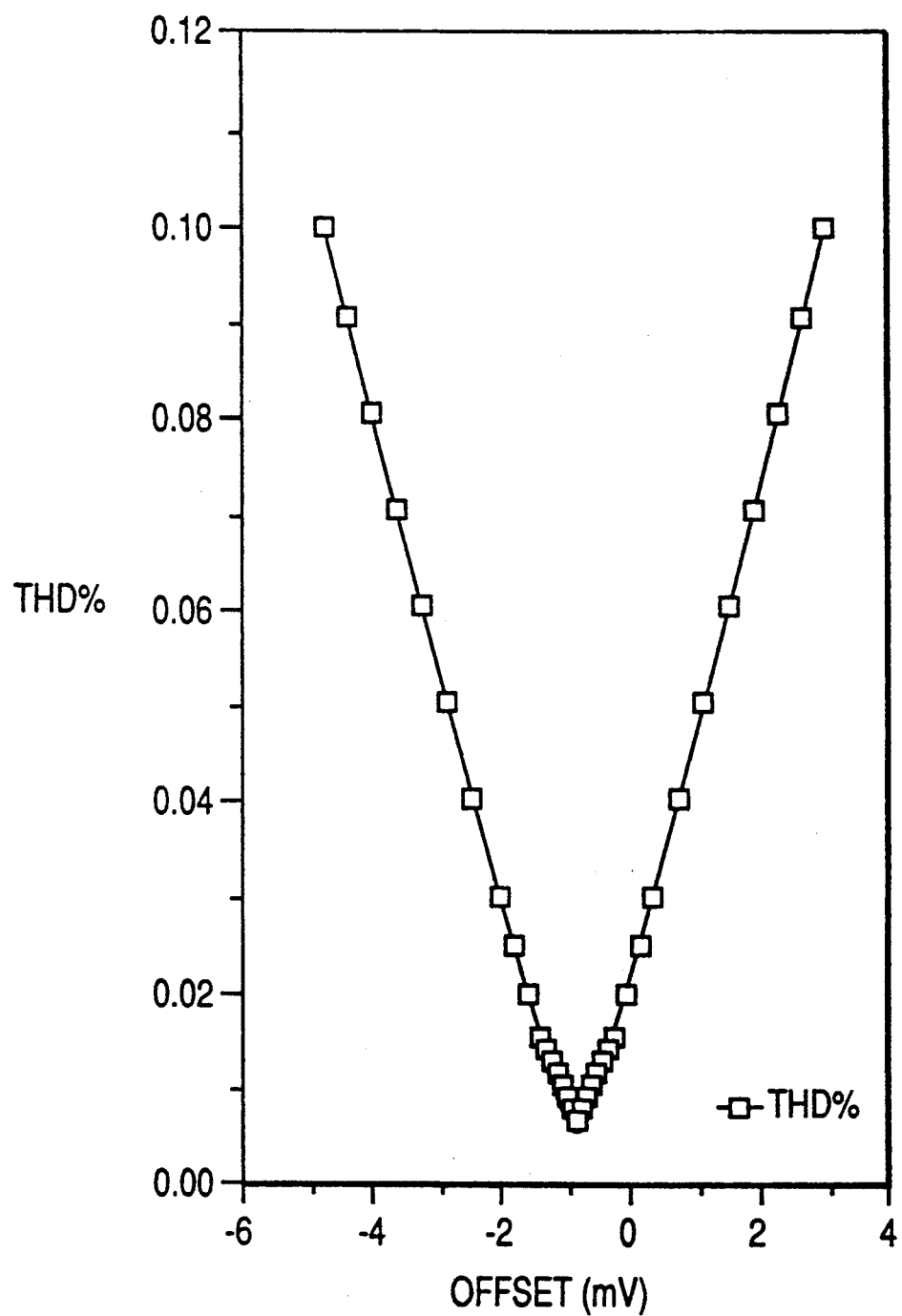
FIG. 2 is a sample graph illustrating THD vs. offset for a typical VCA.

With reference to FIG. 1, a description of one circuit for implementing the present invention will now be described.

As shown in FIG. 1, there is a VCA, for example, a dbx 215X of the dbx 2150 series which receives an input signal ($V_{IN}$), through a resistor-capacitor network (e.g. C1, C2, R1, R2 and R3) and a control voltage input ($CV_{IN}$) from a fader circuit (not shown). An output signal ($V_O$) is output from the VCA through an OP-AMP (IC1) which is preferably a low off-set OP-AMP, i.e. where the offset voltage is less than about 0.25 mV, for example. The dbx 215X series voltage controlled amplifiers are available from dbx, Incorporated, Newton, Mass. and described in publications entitled "dbx 2150A, 2151 Voltage Controlled Amplifier", and "Application Note 106, THE dbx 2150 Series Voltage controlled Amplifiers", which are incorporated by reference.

According to one aspect of the present invention, the output signal $V_O$ is fed back to a distortion adjustment port (4) of the VCA through a servo amplifier circuit 10. The output $V_O$ is provided through OP-AMP IC2 and the associated resistor ($R_F$) and capacitor ($C_3$) which effectively act as a low pass filter. The corner frequency of this filter is chosen to be fairly low, preferably on the order of about 0.1 Hz, so that substantially only the DC componenet of $V_O$ ($V_{O(D.C.)}$) is passed through the filter. The servo amplifier circuit 10 provides a DC signal ($V_C$) to the distortion adjustment port (4) of the vCA to automatically provide distortion adjustment therefor. This obviates the need for manually trimming by using trimming potentiometers as was done in the prior art.

Based on our observations, there is a narrow range of values of $V_{O(D.C.)}$ for which distortion is a minimum. This value may be called $V_{O(Fixed)}$. From our experiments, we have determined that this value typically may range from about $-0.4$ mV to about $-0.6$ mV. Therefore, $V_{O(FIXED)}$ may be chosen to be about $-0.5$ mV. It is advantageous then to determine what the input at pin 4 should be to ensure this value for $V_{O(FIXED)}$. Since this value depends on various internal factors, it is different for different VCAs.

In general, however, the equation of the servo amplifier (at D.C.) is:

$$V_C = \left[\left(\frac{R_F}{R_I} + 1\right)V_{REF} - \left(\frac{R_F}{R_I}\right)V_{O(D.C.)}\right]\frac{R_5}{R_4 + R_5}$$

$V_{REF}$, the input to the non-inverting terminal of IC2, is preferably chosen so that:

$$\left(\frac{R_F}{R_I} + 1\right)V_{REF} = \left(\frac{R_F}{R_I}\right)V_{O(FIXED)}$$

Based on observed values, the range of voltages on the distortion adjustment port (4) on the VCA is approximately $\pm 1.5$ mV. Based on this data the value of $R_F$, $R_I$, $R_4$ and $R_5$ should be chosen so that for typical values of $V_{REF}$, the value of:

$$\left(\frac{R_F}{R_I} + 1\right)V_{REF}\left(\frac{R_5}{R_4 + R_5}\right)$$

will be approximately within the range of $\pm 1.5$ mV.

Therefore, according to the present invention, the servo amplifier circuit can be used to replace one or more trimming potentiometers to automatically adjust the distortion of the output signal and thereby overcome various drawbacks of the prior art.

While the foregoing is a description of a preferred embodiment of the present invention, various alternatives will be readily apparent to one of ordinary skill in the art. The servo amplifier circuit need not be exactly as shown, but may be modified within the scope and content of the present invention. The invention is only limited by the claims appended hereto.

I claim:

1. In a signal mixing apparatus comprising a voltage controlled amplifier (VCA) of the dbx 2150 series having a distortion adjustment port and which receives an input signal and a fader control input signal and outputs an output signal susceptible to distortion, an apparatus for automatically providing distortion trimming comprising:

feedback means operatively connected for feeding said output signal back to said distortion adjustment port of said voltage controlled amplifier, said feedback means comprising low pass filter means for low pass filtering said output signal and for providing said low pass filtered signal to said distortion adjustment port of said voltage controlled amplifier to trim distortion of said output signal.

2. In a signal mixing apparatus comprising a voltage controlled amplifier which receives an input signal and outputs an output signal susceptible to distortion, an apparatus for automatically providing distortion trimming comprising:

feedback means operatively connected for feeding said output signal back to an input of said voltage control amplifier, said feedback means comprising low pass filter means for low pass filtering said output signal and for providing said low pass filtered signal to said voltage controlled amplifier to trim distortion of said output signal;

wherein said feedback means comprises a servo amplifier circuit comprising an op-amp having an inverting and a non-inverting input, and an output connected to a voltage divider network comprising a first resistor ($R_4$) and a second resistor ($R_5$), and wherein a first voltage ($V_{REF}$) is supplied to said non-inverting input and said output signal is supplied to said inverting input through a third resistor ($R_1$) and further wherein a fourth resistor ($R_F$) and a capacitor ($C_3$) are connected in parallel between the inverting input and the output of the op-amp.

3. The apparatus of claim 2 wherein said op-amp output voltage ($V_c$) is equal to:

$$\left[\left(\frac{R_F}{R_I} + 1\right)V_{REF} - \left(\frac{R_F}{R_I}\right)V_{O(D.C.)}\right]\frac{R_5}{R_4 + R_5}$$

where $V_{O(D.C.)}$ is the D.C. component of $V_{O1}$, and $V_{REF}$ is chosen so that:

$$\left(\frac{R_F}{R_I} + 1\right)V_{REF} = \left(\frac{R_F}{R_I}\right)V_{O(FIXED)}$$

where $V_{O(FIXED)}$ is a predetermined value between about $-0.4$ mV and $-0.6$ mV.

* * * * *